United States Patent [19]
Worley

[11] 3,970,970
[45] July 20, 1976

[54] MULTIPLE ACOUSTICALLY COUPLED SURFACE ACOUSTIC WAVE RESONATORS

[75] Inventor: James C. Worley, Coral Springs, Fla.

[73] Assignee: Motorola, Inc., Schaumburg, Ill.

[22] Filed: June 30, 1975

[21] Appl. No.: 591,588

[52] U.S. Cl. .............................. 333/72; 310/8.2; 310/9.8
[51] Int. Cl.² .................... H03H 9/26; H03H 9/32; H01L 41/04
[58] Field of Search ......................... 333/30 R, 72; 331/107 A; 310/8, 8.1, 8.2, 9.8

[56] References Cited
UNITED STATES PATENTS

| | | | |
|---|---|---|---|
| 3,716,809 | 2/1973 | Reeder et al. | 333/72 X |
| 3,781,717 | 12/1973 | Kuenemund | 333/72 X |
| 3,882,430 | 5/1975 | Maerfeld | 333/30 R |
| 3,883,831 | 5/1975 | Williamson et al. | 333/30 R |

*Primary Examiner*—Alfred E. Smith
*Assistant Examiner*—Marvin Nussbaum
*Attorney, Agent, or Firm*—Eugene A. Parsons; James W. Gillman

[57] ABSTRACT

A base of piezoelectrically active material having a plurality of spaced apart reflectors formed thereon and transducers positioned between at least some of said adjacent reflectors to produce standing waves at a predetermined frequency, the reflectors between transducers being formed with less than one hundred percent reflectivity so that energy from a standing wave between a pair of adjacent reflectors is coupled through the system to other pairs of reflectors for producing standing waves therebetween. The transducers may operate as electrical energy inputs or as taps to remove energy from the system.

8 Claims, 4 Drawing Figures

U.S. Patent  July 20, 1976  3,970,970
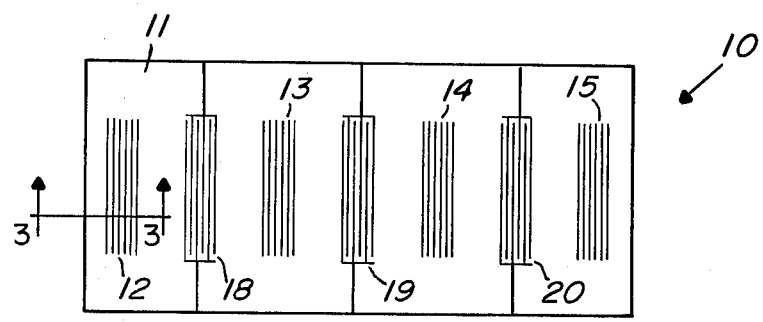
Fig.1
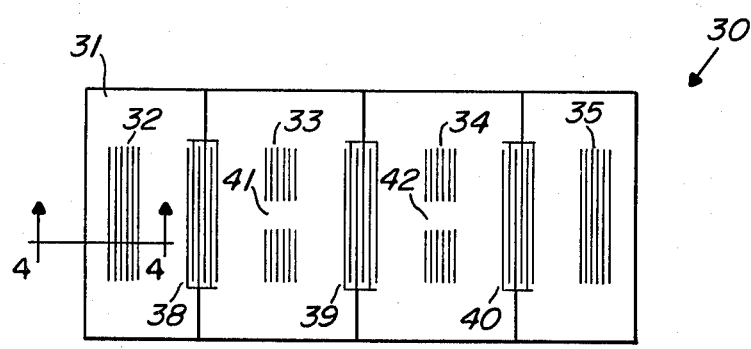
Fig.2
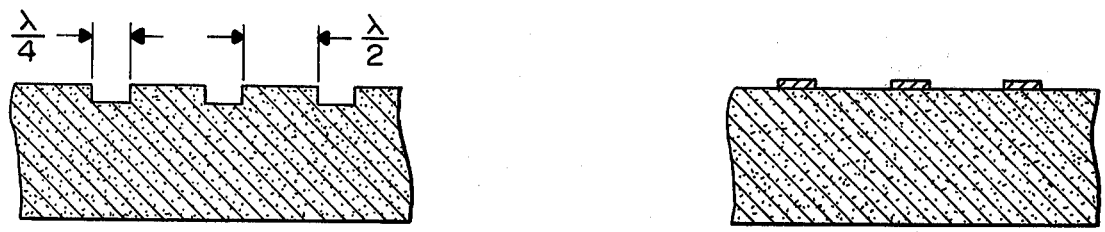
Fig.3
Fig.4

MULTIPLE ACOUSTICALLY COUPLED SURFACE ACOUSTIC WAVE RESONATORS

BACKGROUND OF THE INVENTION

In some applications, particularly band pass filters, discriminators, and the like, it is desirable to have highly stable devices for passing or selecting signals having predetermined frequencies while dissipating or rejecting any remaining signals with different frequencies. In prior art devices this is accomplished through the use of monolithic crystal filters, which include several acoustic resonators on a single substrate acoustically coupled by bulk acoustic waves. However, monolithic crystal filters are relatively complicated to fabricate and are relatively expensive. Further, it is relatively complicated to produce several acoustic resonators, resonant at different frequencies, on a single substrate.

SUMMARY OF THE INVENTION

The present invention pertains to multiple acoustically coupled surface acoustic wave resonators including a base of piezoelectrically active material with a plurality of reflectors formed on said base and positioned along a predetermined axis thereof with each reflector being spaced from an adjacent reflector a multiple of one-half wavelength of a predetermined resonant frequency, a plurality of transducers each one of which is positioned on said base between an adjacent pair of said reflectors for producing a standing wave at a predetermined resonant frequency between said adjacent pair and each of said reflectors between said transducers being formed with less than one hundred percent reflectivity for allowing the passage of energy therethrough and the coupling of energy from a standing wave between a pair of reflectors to produce a standing wave between an adjacent pair of reflectors.

It is an object of the present invention to provide new and improved multiple acoustically coupled surface acoustic wave resonators.

It is a further object of the present invention to provide multiple acoustically coupled surface acoustic wave resonators which are less expensive and complicated to fabricate, which may operate at higher frequencies than monolithic crystal filters and which require less space.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a view in top plan of multiple acoustically coupled surface acoustic wave resonators embodying the present invention;

FIG. 2 is a view similar to FIG. 1 of another embodiment;

FIG. 3 is an enlarged sectional view of a portion of the device illustrated in FIG. 1 as seen from the line 33 in FIG. 1; and FIG. 4 is an enlarged sectional view of a portion of the device illustrated in FIG. 2 as seen from the line 44 in FIG. 2.

DESCRIPTION OF THE PREFERRED EMBODIMENTS

Referring specifically to FIG. 1, the numeral 10 generally designates multiple acoustically coupled surface acoustic wave resonators including a base 11 of piezoelectrically active material having a plurality of surface acoustic wave reflectors 12 through 15 positioned thereon in spaced apart relationship along the longitudinal axis of the base 11 with surface acoustic wave transducers 18, 19 and 20 interspersed therebetween. The adjacent reflectors 12 and 13 form a first resonator which operates at a predetermined resonant frequency dependent upon the spacing between the reflectors 12 and 13 and the transducer 18 serves to input or output energy to this resonator. The adjacent reflectors 14 and 15 form a second resonator which operates at a predetermined resonant frequency dependent upon the spacing between the reflectors 14 and 15 and the transducer 20 serves to input or output energy to this resonator. Reflectors 13 and 14 form a third resonator with a resonant frequency predetermined by the spacing between the reflectors. The transducer 19 is optional and may be used to adjust the impedance of the resonator formed by the adjacent reflectors 13 and 14 or it may be used as a tap for devices such as discriminators.

In the present embodiment the transducers 18, 19 and 20 are of the interdigital type wherein a plurality of spaced apart fingers of conductive material are deposited on the surface of the base and a reference potential, such as ground, is connected to every other finger while the remaining fingers have a potential applied thereto to create an electric field between the fingers which produces surface acoustic waves in the base 11. It should be understood that the transducers 18, 19 and 20 may take any form which will enhance the operation of the device, including single finger pairs, multiple identical finger pairs, apodized finger pairs, etc.

The reflectors 12–15 may also be produced in a variety of forms, including etched grooves, overplate, or multi-strip-coupler reflectors. The etched groove reflector is one or more grooves which are mechanically or chemically etched into the surface of the base 11. If a single groove reflector is utilized the groove must be three or more wavelengths, of the resonant frequency of the resonator, deep to produce one hundred percent reflection of the energy in the resonator. However, this is not practical since etched single groove type reflectors with a very high reflection coefficient cause a mode conversion at the edge and resonance is lost. Thus, to produce an etched groove reflector a plurality of etched grooves are formed, each one being one quarter wavelength wide and something less than a wavelength deep as illustrated in FIG. 3. The etched grooves are formed in parallel spaced apart relationship, generally one-half wavelength apart, with the number of grooves being dependent upon the reflection coefficient of each groove and the total reflection coefficient desired. In a practical etched groove reflector each groove may reflect, for example, approximately two percent of the energy and as many as 200 grooves may be required to approach 100 percent reflectivity. It should be noted that 100 percent reflectivity can never be reached in this type reflector but substantially 100 percent reflectivity can be attained, the actual reflectivity attained being dependent upon the requirements of the device. However, since the range of frequencies in which the present surface acoustic wave resonators are utilized is generally 50 megahertz to 450 megahertz, the etched grooves are extremely small and a reflector with as many as two hundred grooves is still relatively small.

The overplate and the multi-strip-coupler coupler reflectors are generally similar in that they both include single or multiple strips of metal or dielectric deposited on the surface of the base 11 to create an impedance discontinuity for the surface acoustic waves, see FIG. 4. The overplate reflector mass loads the piezoelectric material in the base 11 to damp the surface acoustic waves while the multi-strip-coupler reflector piezoelectrically detects a surface acoustic wave and regenerates a travelling wave.

In the multiple resonators device 10 of FIG. 1 the first resonator is constructed so that the reflector 12 has a reflection coefficient as close to one hundred percent as is practical and the reflector 13 has a reflection coefficient less than one hundred percent. Similarly the second resonator is constructed so that the reflector 15 has a reflection coefficient as close to one hundred percent as practical and the reflector 14 has a reflection coefficient less than one hundred percent. When either or both of the transducers 18 and 20 insert a surface acoustic wave of a predetermined resonant frequency in the first and second resonators, respectively, a standing wave is set up between the reflectors 11–13 and 14–15, respectively. Because the reflectors 13 and 14 have a reflection coefficient less than one hundred percent, some of the energy of the standing wave is coupled to the center transducer 19. Each of the resonators on the device 10 is tuned to a predetermined frequency by the spacing between the reflectors in the resonator. By spacing the reflectors apart a multiple of one-half wavelength of the desired frequency such that a standing wave is set up between the reflectors at that desired frequency, the resonator becomes resonant at that desired frequency. If the reflectors are spaced many wavelengths apart, resonance of the resonator is further enhanced because only surface acoustic waves near the resonance frequency will arrive back at the transducer in phase to produce the standing wave in the resonator.

Assuming the device 10 in FIG. 1 is a filter, the reflection coefficient of either of the reflectors 13 or 14 is one hundred percent minus K, where K is the bandwidth of the filter divided by the center frequency times the coupling coefficient of the type of filter. The coupling coefficient of the type of filter is readily available in tables published for the design of filters. Thus, it can be seen that filters having relatively narrow bandwidths require reflectors, between transducers, having relatively high reflection coefficients, generally between 95 and 100 percent and filters having relatively wide bandwidths require reflectors having lower reflection coefficients, generally 85 to 95 percent. Depending upon the application of the device 10, the first and second resonators may be tuned to the same resonant frequency or to different resonant frequencies if the devices to be used in a filter or a discriminator, respectively. It should also be understood that additional, or fewer, resonators might be fabricated on the base and coupled together as described above.

Referring specifically to FIG. 2, multiple acoustically coupled surface acoustic wave resonators generally designated 30 are illustrated including a base 31 of piezoelectriccally active material having reflectors 32 through 35 positioned thereon and spaced apart along the longitudinal axis thereof. Three transducers 38, 39 and 40 are positioned between the reflectors 32–35 as described in conjunction with the device 10 of FIG. 1. In this embodiment the reflectors 32 and 35 are constructed with a reflectivity, or reflection coefficient, as near 100 percent as practical. The reflectors 33 and 34 are constructed similar to the reflectors 32 and 35 with the maximum possible reflectivity but each of the reflectors 33 and 34 has a central opening 41 and 42, respectively, therethrough to provide coupling between adjacent resonators. In this configuration, some of the energy from the standing waves in the first resonator (reflectors 32 and 33 and transducer 38) or the second resonator (reflectors 34 and 35 and transducer 40) leaks through the opening 41 or 42 in the central reflector 33 or 34 and the central transducer or electrode 39 serves the purpose of spreading the surface acoustic wave over the resonator with a uniform phase front. Again, the transducer or electrode 39 may serve as an input transducer, an output electrode, an impedance control or a multi-strip-coupler.

Thus, multiple acoustically coupled surface acoustic wave resonators are illustrated and disclosed wherein a variety of reflectors and transducers or electrodes may be utilized to produce a plurality of resonators on a single base of piezoelectrically active material. The plurality of resonators on a single base have a variety of uses, including filters, discriminators, etc. Further, the various resonators on a single base can be constructed to resonate at different frequencies by simply changing the spacing of the reflectors in the various resonators. Because the resonators operate with surface acoustic waves, there is no necessity for a great bulk of material and the base of piezoelectrically active material may be a piezoelectrically active overlay film on an inactive substrate or the transducers and reflectors may be sandwiched between the overlay and the substrate. Thus, the disclosed multiple resonators on a single base is a planar device.

While I have shown and described specific embodiments of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. Multiple acoustically coupled surface acoustic wave resonators comprising:
   a. a base of piezoelectrically active material;
   b. a first surface wave acoustic resonator having a resonant frequency and including a first transducer affixed to said base for propagating surface waves on said base along a predetermined axis of said base upon proper energization of said first transducer, and first reflectors formed on said base on each side of said first transducer along the predetermined axis and spaced from each other a multiple of one-half wavelength of the resonant frequency of said first resonator for producing a standing wave between said first reflectors when said first transducer is properly energized;
   c. a second surface wave acoustic resonator positioned on said base along the predetermined axis in spaced relation from said first resonator and having a resonant frequency and including a second transducer for propagating surface waves on said base upon proper energization of said second transducer, and second reflectors formed on said base on each side of said second transducer along the predetermined axis and spaced from each other a multiple of one-half wavelengths of the resonant frequency of said second resonator for producing a standing wave between said second reflectors when said second transducer is properly energized; and d. the outermost first and second reflectors being constructed with substantially one hundred percent reflectivity of energy at the resonant frequency of the first and second resonators, respectively, and the innermost or adjacent first and second reflectors being constructed with less reflectivity for providing acoustical coupling between said first and second resonators.

2. Multiple acoustically coupled surface acoustic wave resonators as claimed in claim 1 wherein the first and second transducers each include a plurality of elongated generally rectangular electrodes deposited on the surface of the base with the longitudinal axes thereof perpendicular to the predetermined axis of said base.

3. Multiple acoustically coupled surface acoustic wave resonators as claimed in claim 1 wherein the first and second resonators are positioned on the base so that the adjacent first and second reflectors are spaced apart a multiple of one-half wavelength of the resonant frequency of one of said first and second resonators for producing a standing wave between said adjacent reflectors.

4. Multiple acoustically coupled surface acoustic wave resonators as claimed in claim 3 including in addition a transducer positioned on the base between the adjacent first and second reflectors.

5. Multiple acoustically coupled surface acoustic wave resonators as claimed in claim 1 wherein the adjacent first and second reflectors are constructed with gaps therein for allowing the passage of some energy therethrough and providing acoustical coupling between said first and second resonators.

6. Multiple acoustically coupled surface acoustic wave resonators as claimed in claim 1 wherein the reflectors constructed with substantially one hundred percent reflectivity are grooves formed in the base with a depth of at least three wavelengths at the resonant frequency and the reflectors constructed with less than one hundred percent reflectivity are grooves formed in the base with a depth less than three wavelengths at the resonant frequency.

7. Multiple acoustically coupled surface acoustic wave resonators as claimed in claim 1 wherein the resonant frequencies of the first and second resonators are the same.

8. Multiple acoustically coupled surface acoustic wave resonators comprising:

a. a base of piezoelectrically active material;

b. a plurality of reflectors formed on said base, each being generally rectangular in shape and positioned along a predetermined axis of said base with the longitudinal axis of each reflector perpendicular to the predetermined axis of said base, and each reflector being spaced from an adjacent reflector a multiple of one-half wavelength of a predetermined resonant frequency;

c. a plurality of transducers each one of which is positioned on said base between an adjacent pair of said reflectors for producing a standing wave at a predetermined resonant frequency between said adjacent pair; and d. each of said reflectors which has an adjacent reflector on each side thereof being formed with less than one hundred percent reflectivity for allowing the passage of energy therethrough.

* * * * *